(12) United States Patent
Huang et al.

(10) Patent No.: US 8,461,651 B2
(45) Date of Patent: Jun. 11, 2013

(54) ESD PROTECTION DEVICES FOR SOI INTEGRATED CIRCUIT AND MANUFACTURING METHOD THEREOF

(75) Inventors: Xiaolu Huang, Shanghai (CN); Xing Wei, Shanghai (CN); Xinhong Cheng, Shanghai (CN); Jing Chen, Shanghai (CN); Miao Zhang, Shanghai (CN); Xi Wang, Shanghai (CN)

(73) Assignee: Shanghai Institute of Microsystem and Information Technology, Chinese Academy of Sciences, Changning District Shanghai (CN)

( * ) Notice: Subject to any disclaimer, the term of this patent is extended or adjusted under 35 U.S.C. 154(b) by 122 days.

(21) Appl. No.: 13/002,303

(22) PCT Filed: Dec. 16, 2010

(86) PCT No.: PCT/CN2010/079847
§ 371 (c)(1),
(2), (4) Date: Dec. 30, 2010

(87) PCT Pub. No.: WO2012/058840
PCT Pub. Date: May 10, 2012

(65) Prior Publication Data
US 2012/0112283 A1    May 10, 2012

(30) Foreign Application Priority Data

Nov. 4, 2010   (CN) .......................... 2010 1 0532715

(51) Int. Cl.
*H01L 29/00* (2006.01)
(52) U.S. Cl.
USPC .......................................... 257/350; 257/367
(58) Field of Classification Search
USPC ................................... 257/350.367, E27.016
See application file for complete search history.

(56) References Cited

U.S. PATENT DOCUMENTS

| 5,780,912 | A | * | 7/1998 | Burr et al. ..................... 257/408 |
| 6,060,745 | A | * | 5/2000 | Tadokoro et al. ............. 257/329 |
| 7,968,921 | B2 | * | 6/2011 | Bulucea et al. ............... 257/288 |
| 2002/0048919 | A1 | * | 4/2002 | Iwamatsu et al. ............. 438/592 |
| 2010/0244131 | A1 | * | 9/2010 | Bulucea et al. ............... 257/336 |

* cited by examiner

*Primary Examiner* — Howard Weiss
*Assistant Examiner* — Steven Rao
(74) *Attorney, Agent, or Firm* — Global IP Services; Tianhua Gu

(57) ABSTRACT

The present invention discloses an ESD protection structure in a SOI CMOS circuitry. The ESD protection structure includes a variety of longitudinal (vertical) PN junction structures having significantly enlarged junction areas for current flow. The resulting devices achieve increased heavy current release capability. Processes of fabricating varieties of the ESD protection longitudinal PN junction are also disclosed. Compatibility of the disclosed fabrication processes with current SOI technology reduces implementation cost and improves the integration robustness.

7 Claims, 4 Drawing Sheets

ESD PROTECTION DEVICES FOR SOI INTEGRATED CIRCUIT AND MANUFACTURING METHOD THEREOF

CROSS REFERENCE TO RELATED PATENT APPLICATION

This patent application is the US national stage of PCT/CN2010/079847 filed on Dec. 16, 2010, which claims the priority of the Chinese patent application No. 201010532715.3 filed on Nov. 4, 2010, that application is incorporated herein by reference.

FIELD OF THE INVENTION

The present invention relates to the field of semiconductor integrated circuitry, and more particularly to ESD protection for SOI CMOS devices.

BACKGROUND OF THE INVENTION

CMOS devices fabricated on silicon-on-insulator (SOI) substrates provide higher speed and consume less power. Similar to bulk silicon circuits, ESD protection is critical in circuit design and applications in order to achieve device reliability. Diode network structure techniques used in bulk silicon circuits for ESD protection, such as duo-diode, single diode or MVI (Mixed Voltage Interface) composed of diode string networks, are generally adopted for ESD protection in SOI circuits.

However, the buried oxide layer (BOX) in SOI circuits isolates device from substrate—a mechanism leading to ESD failure mode. Usually, ESD design generally adopts the form of a lateral diode such as the gated diode ESD protection device shown in FIG. 1. However, the lateral diode structure presents two major challenges. The first challenge is that the small junction area is vulnerable to defect, because of the heavy current density. These defects prohibit a device from releasing heavy current when needed, and eventually lead to ESD failure. However, attempts to enlarge the ESD diode junction area result in increased device domain area, making scaling difficult.

Chinese Patent Application No. 200910201331.0 (CN200910201331.0) tries to solve the problem of breaking-down of ESD protection devices, by fabricating a diode spacer with an epitaxial layer to achieve the ESD protection effect of a traditional longitudinal diode in bulk silicon. Although the CN200910201331.0 design overcomes the junction defect problem, the spacer structure complicates the manufacturing process and reduces the device integration level, resulting in high overall cost.

Therefore, there is a need for a simpler and low cost ESD protection device for SOI integrated circuitry.

SUMMARY OF THE INVENTION

Consistent with some embodiments of the present invention, an ESD protection structure in SOI is provided. The ESD protection structure comprises: a semiconductor SOI substrate having a top silicon film; a channel having a longitudinal diode formed in the top silicon film, wherein the longitudinal diode includes a PN junction structure having an N-type region and a P-type region; a positive electrode and a negative electrode formed respectively at the two opposite ends of the channel; an ESD protection node; and a gate dielectric layer and a gate electrode successively formed over the channel.

Preferably, the semiconductor substrate includes a Si substrate; a buried oxide layer (BOX) formed over the Si substrate and a top silicon film formed over the buried oxide layer.

Preferably, a side-wall spacer is formed surrounding the gate dielectric layer and the gate electrode.

Preferably, a shallow trench isolation region is formed surrounding the gated diode ESD protection device.

Preferably, the P-type region of the channel is formed over the N-type region, forming a P-type gated diode ESD protection structure.

Preferably, the N-type region of the channel is formed over the P-type region, forming an N-type gated diode ESD protection structure.

Consistent with another embodiment of the present invention, an ESD protection structure comprises: a semiconductor SOI substrate having a top silicon film; a first channel having a longitudinal N-type diode formed in the top silicon film, wherein the longitudinal N-type diode includes a PN junction structure having an N-type region above a P-type region; a positive electrode and a negative electrode formed respectively at the two opposite ends of the first channel; a gate dielectric layer and a gate electrode successively formed over the first channel; a second channel having a longitudinal P-type diode formed in the top silicon film, wherein the longitudinal P-type diode includes a PN junction structure having a P-type region above an N-type region; a positive electrode and a negative electrode formed respectively at the two opposite ends of the second channel; a gate dielectric layer and a gate electrode successively formed over the second channel; and an ESD protection node coupled to the negative electrode of the first channel and the positive electrode of the second channel.

Consistent with other embodiments of the present invention, a method of manufacturing an ESD protection device in SOI circuit is also provided. The method includes the following steps: providing a SOI substrate having a top silicon film, a buried oxide layer, and a silicon substrate; forming a longitudinal PN junction structure including a P-type region and a N-type region in the top silicon film of the SOI substrate; forming a gate dielectric layer and a gate electrode layer successively over the longitudinal PN junction; forming a spacer and forming a P+ region as the positive electrode and a N+ region as the negative electrode respectively at the two opposite ends of the longitudinal PN junction structure to form a gated diode ESD protection device.

DETAILED DESCRIPTION OF THE EMBODIMENTS

The present invention is further explained in detail according to the accompanying drawings.

First Embodiment

Figure 1:
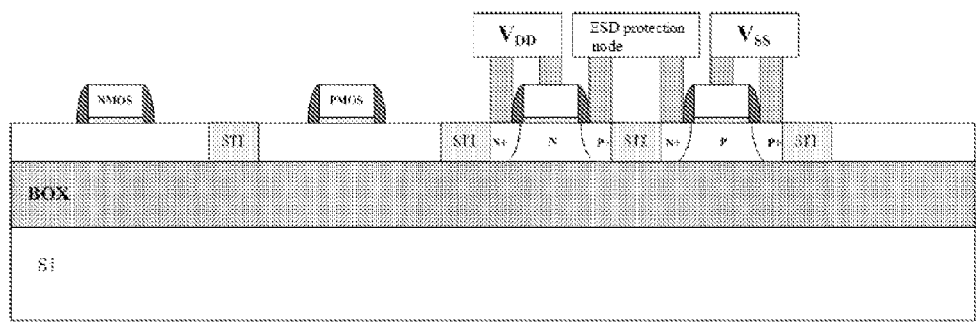
FIG. 1 is a cross sectional view of a conventional gated-diode ESD protection structure in SOI.
Figure 2:
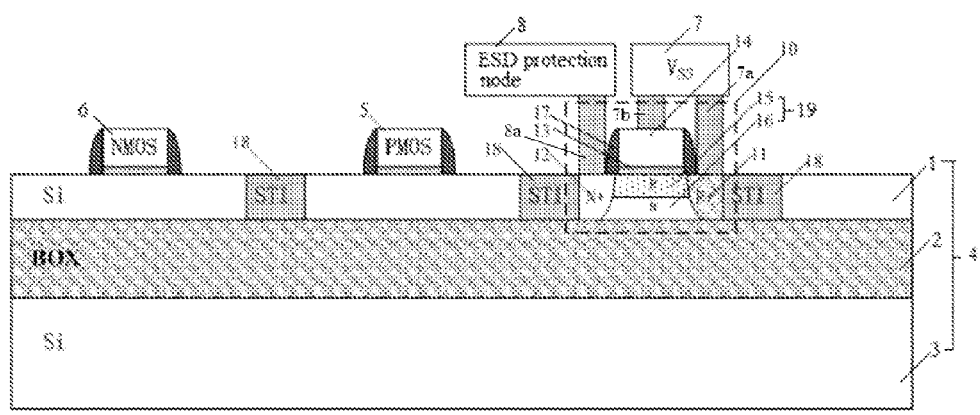
FIG. 2 is a cross sectional view of an ESD protection structure in SOI, according to the first embodiment of the present invention.

FIG. 2 illustrates the cross sectional view of a P-type gate-diode ESD protection structure in a SOI circuit, according to the first embodiment of the present disclosure. The P-type gated-diode ESD protection structure in a SOI circuit includes a semiconductor substrate 4 and a P-type gated diode ESD protection device 10 (enclosed in the dashed lined box) formed on the semiconductor substrate 4.

The semiconductor substrate 4 includes a Si substrate 3; a buried oxide layer (BOX) 2 formed on the Si substrate 3 and a top silicon film 1 formed on the buried oxide layer 2. There are a number of PMOS transistors and NMOS transistors in the vicinity, generally isolated from each other by shallow trench isolation region (STI) 18 fabricated in the semiconductor substrate 4. For reference, only one PMOS transistor 5 and one NMOS transistor 6 are shown in FIG. 2

The P-type gated diode ESD protection device 10 includes a channel 19, a positive electrode (P+ region) 11, a negative electrode (N+ region) 12 formed respectively at the two opposite ends of channel 19, a gate dielectric layer 13 and a gate electrode layer 14 successively formed on channel 19. Channel 19 consists of a bottom N-type region 16 and a top P-type region 15 located on top of the N-type region 16. The top P-type and bottom N-type regions form a longitudinal (vertical) PN junction structure in channel 19.

The P-type gated-diode ESD protection device 10 further includes a side-wall spacer 17 formed surrounding gate dielectric layer 13 and gate electrode 14. A shallow trench isolation region 18 is formed enclosing gated-diode ESD protection device 10.

Contrary to a conventional P-type channel gated-diode where the diodes are laterally positioned with limited channel layer thickness to form the PN junction area, P-type gated diode ESD protection device 10 has a vertical PN junction structure, significantly increased the gated-diode PN junction area without changing the device size. With a much larger PN junction, the current releasing capability at time of a heavy current surge is increased and the integration level of the ESD protection circuit in SOI is enhanced.

Connector 8a ties negative electrode 12 of the P-type gated diode protection device 10 to the ESD protection node 8 in the SOI circuit. Connector 7a ties positive electrode 11 to Vss 7 (negative power supply or ground) and connector 7b ties gate electrode 14 to Vss 7. ESD protection node 8 and Vss are external electrical contacts for a gated single-diode ESD protection circuit, as shown in FIG. 4b.

Second Embodiment

Figure 3:
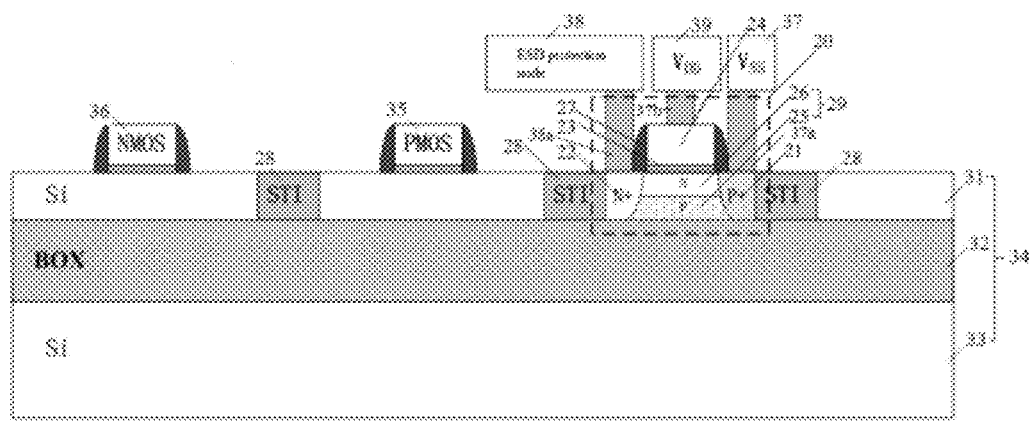
FIG. 3 is a cross sectional view of an ESD protection structure, according to the second embodiment of the present invention.

FIG. 3 is the cross sectional view of an N-type gated single diode ESD protection structure, according to the second embodiment of the present invention. The N-type gated single diode ESD protection structure includes a semiconductor substrate 34, and a N-type gated diode ESD protection device 20 formed on the semiconductor substrate 34; the semiconductor substrate 34 includes a Si substrate 33; a buried oxide layer (BOX) 32 formed on the Si substrate 33, and a top silicon film 31 formed on the buried oxide layer 32. There are a number of PMOS transistors and NMOS transistors in the vicinity, isolated by shallow trench isolation region (STI) 38 fabricated on the semiconductor substrate 34. For reference, only one PMOS transistor 35 and one NMOS transistor 36 are shown in FIG. 3.

The N-type gated diode ESD protection device 20 includes a channel 29, a positive electrode (P+ region) 21, a negative electrode (N+ region) 22 formed respectively at the two opposite ends of the channel 29, a gate dielectric layer 23 and a gate electrode 24 successively formed over the channel 29. The channel 29 consists of a P-type region 25 and an N-type region 26 which is formed on the P-type region 25. The P-type and N-type regions form a longitudinal (vertical) PN junction structure.

The N-type gated diode ESD protection device 20 further includes a side-wall spacer 27 formed surrounding the gate dielectric layer 23 and the gate electrode 24, and a shallow trench isolation region 28 is formed enclosing gated-diode ESD protection device 20.

Contrary to a conventional N-type channel gated-diode where the diodes are laterally formed and the channel layer thickness limits the PN junction area size, N-type gated diode ESD protection device 20 has a longitudinal PN junction structure; therefore the gated-diode PN junction area is greatly increased without changing the device size. With a larger PN junction, the current releasing capability is increased and the integration level of the ESD protection circuit in SOI is enhanced.

Connector 38a ties negative electrode 22 of the N-type gated diode protection device 20 to the ESD protection node 38 in the SOI circuit. Connector 37a ties positive electrode 21 to Vss 37 (negative power supply or ground) and connector 37b ties gate electrode 24 to Vdd 39 (positive supply). ESD protection node 38, Vdd 39, and Vss 37 are external electrical contacts for a gated single-diode ESD protection circuit, as shown in FIG. 4b.

Third Embodiment

Figure 4A:
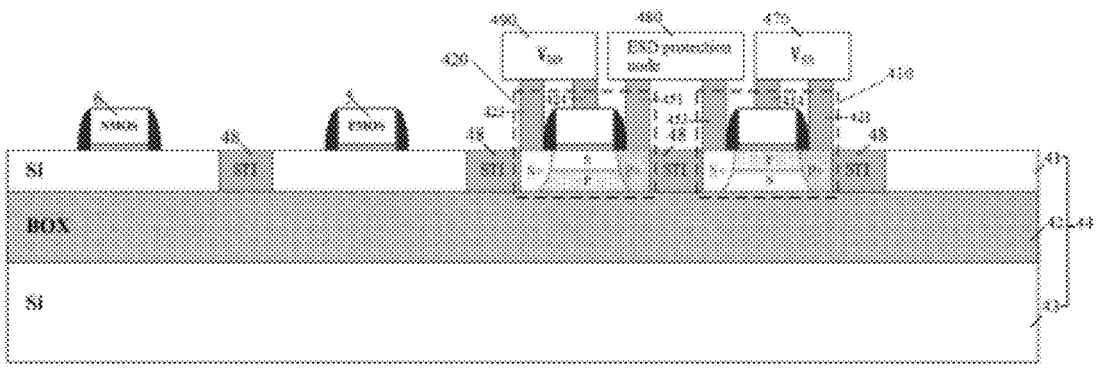
FIG. 4a is a cross sectional view of an ESD protection structure, according to the third embodiment of the present invention.
Figure 4B:
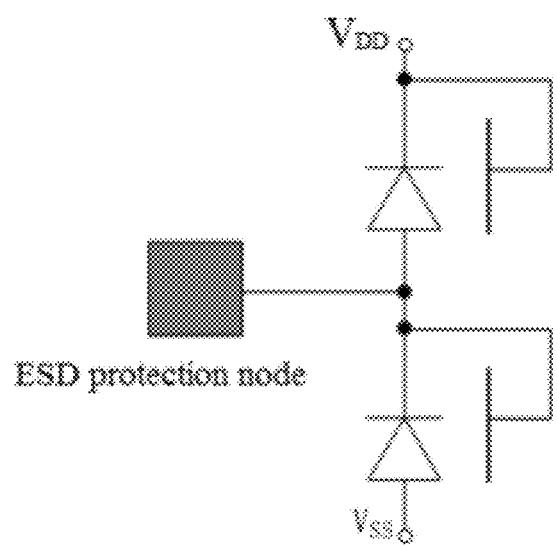
FIG. 4b is a diagram of the duo-diode ESD protection circuit, according to the third embodiment of the present invention.

FIG. 4a is the cross sectional view of a gated duo-diode ESD protection structure in a SOI CMOS circuit. The gated duo-diode ESD protection structure includes a semiconductor substrate 44, a P-type gated diode ESD protection device 410 and an N-type gated diode ESD protection device 420 formed in the semiconductor substrate 44. The semiconductor substrate 44 includes a Si substrate 43; a buried oxide layer (BOX) 42 formed on the Si substrate 43 and a top silicon film 41 formed on the buried oxide layer 42. A number of PMOS transistors and NMOS transistors in SOI CMOS circuits are isolated from each other by shallow trench isolation region (STI) 48, which are fabricated in the semiconductor substrate 44. A PMOS transistor 5 and a NMOS transistor 6 are shown in FIG. 4a.

The N-type gated diode ESD protection device 420 and the P-type gated diode ESD protection device 410 are serially connected. The negative electrode 423 and the gate electrode 424 of the N-type gated diode ESD protection device 420 are connected with $V_{DD}$ 490 (positive power supply). The positive electrode 421 and the gate electrode 414 of the P-type gated diode ESD protection device 410 are connected with Vss 470 (negative power supply or ground). The positive electrode 451 of the N-type gated diode ESD protection device 420 and the negative electrode 453 of the P-type gated diode ESD protection device 410 are both connected with the ESD protection node 480 of the SOI CMOS circuit.

FIG. 4b is the circuit diagram of the gated duo-diode ESD protection structure.

It should be noted that ESD protection structures disclosed in the above embodiments may include other components, such as more gated duo-diode ESD protection devices or other varieties of ESD protection circuits.

FIGS. 5a-5d illustrate process steps in fabricating an ESD protection structure of a SOI CMOS integrated circuit.

Figure 5A:
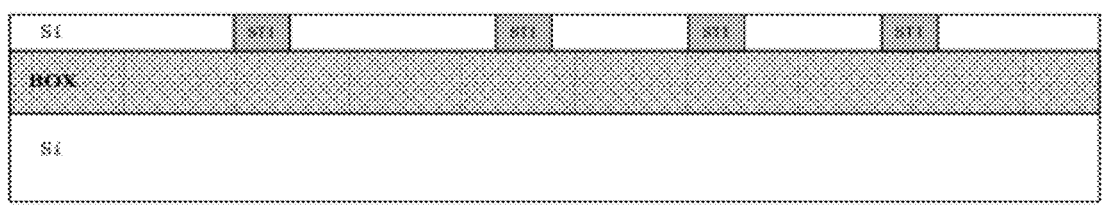
FIGS. 5a-5d describe the manufacturing process of the ESD protection structure, according to some embodiments of the present invention.
Figure 5B:
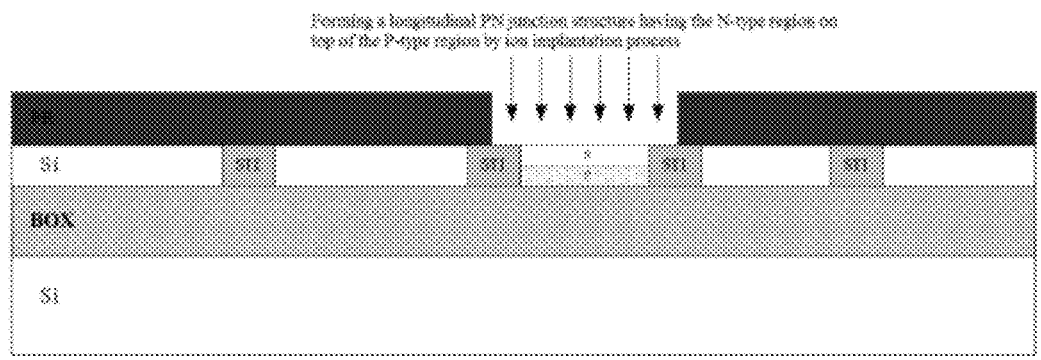
Figure 5C:
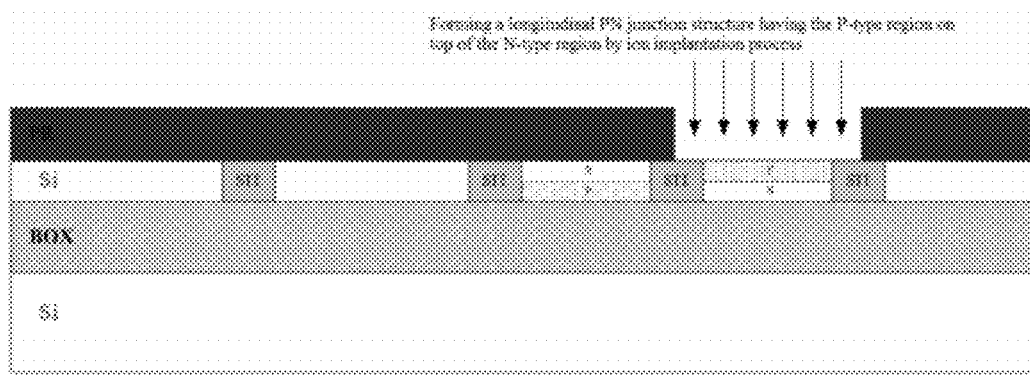
Figure 5D:
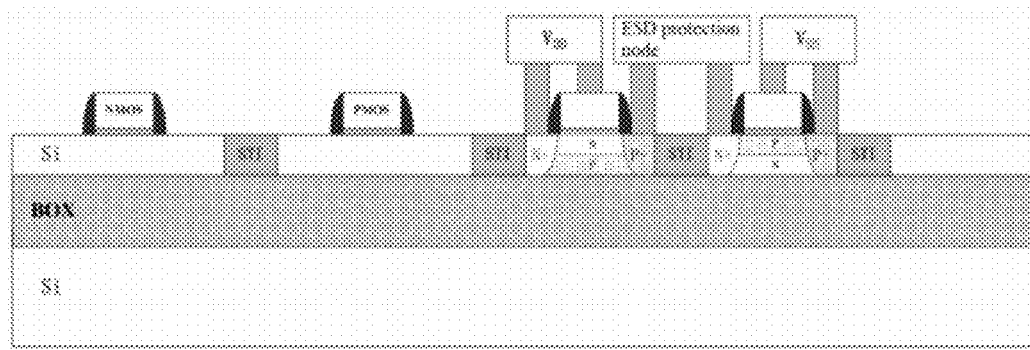

(A) provide a shallow trench isolation region (STI) on a SOI substrate, which has a top silicon film, a buried oxide layer, and a silicon substrate, as shown in FIG. 5a, (B) coat the SOI substrate with photo resist, perform a lithography process, pattern an open window in a given position for an ESD protection device; fabricate a longitudinal PN junction structure consisting of a P-type region and a N-type region in the top silicon film of the SOI substrate. The PN junction may be formed by a number of techniques, for example, including ion implantation process or diffusion. The longitudinal PN junction structure may have the N-type region located above the P-type region to form a N-type gated diode ESD protection device; or the P-type region located above the N-type region to form a P-type gated diode ESD protection device, as shown in FIG. 5b and FIG. 5c.

(C) deposit a gate dielectric layer and a gate electrode layer successively over the longitudinal PN junction; form a spacer and then form a P+ region as the positive electrode and a N+ region as the negative electrode respectively at the two opposite ends of the longitudinal PN junction structure, which has the N-type region located above the P-type region to form a N-type gated diode ESD protection device.

Similarly, a P-type gated diode ESD protection device is fabricated by forming a longitudinal PN junction structure with the P-type region located above the N-type region, followed by depositing a gate dielectric layer and a gate electrode layer successively over the longitudinal PN junction.

(D) complete the ESD protection structure by forming interconnecting structures.

Varieties of ESD protection circuits similar to the ESD protection structure described in the above embodiments could be fabricated by variations of the above process.

An ESD protection device having a longitudinal PN junction structure significantly enlarges the junction area, therefore increases current releasing capability during heavy current surges. The disclosed process of fabricating the ESD protection device is compatible with the current manufacturing process of SOI integrated circuit. Therefore, implementation of the disclosed ESD devices is practical and cost effective.

The above description of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. An ESD protection structure in SOI MOS circuitry, the structure comprising:
    a semiconductor SOI substrate having a top silicon film;
    a channel having a longitudinal diode formed in the top silicon film, wherein the longitudinal diode consisting of an N-type region and a P-type region stacked together vertically;
    a N+-type region as a negative electrode and a P+-type region as a positive electrode formed respectively beside the channel and on a buried oxide layer;
    an ESD protection node connecting with the negative electrode and a $V_{ss}$ node connecting with the positive electrode; and
    a gate dielectric layer and a gate electrode successively formed over the channel.

2. The ESD protection structure in SOI MOS circuitry of claim 1, wherein the longitudinal diode has the P-type region stacked up on a top of the N-type region to form a P-type gated diode.

3. The ESD protection structure in SOI MOS circuitry of claim 1, wherein the longitudinal diode has the N-type region stacked up on a top of the P-type region to form a N-type gated diode.

4. The ESD protection structure in SOI MOS circuitry of claim 1, further comprising a side-wall spacer formed surrounding the gate dielectric layer and the gate electrode.

5. The ESD protection structure in SOI MOS circuitry of claim 1, further comprising a shallow trench isolation region formed surrounding the ESD protection structure.

6. An ESD protection structure in SOI MOS circuitry, the structure comprises:
    a semiconductor SOI substrate having a top silicon film, a buried oxide layer, and a silicon substrate;
    a N-type gated diode ESD protection device formed in the top silicon film comprising:
    a first channel having a longitudinal N-type diode formed in the top silicon film, wherein the longitudinal N-type diode consisting of a N-type region stacked up on a P-type region vertically;
    a N+-type region as a negative electrode and a P+-type region as a positive electrode formed respectively at the two opposite ends of the channel and in the top silicon film, which is on the buried oxide layer;
    a gate dielectric layer and a gate electrode successively formed over the first channel;
    a P-type gated diode ESD protection device formed in the top silicon film comprising:
    a second channel having a longitudinal P-type diode formed in the top silicon film, wherein the longitudinal P-type diode consisting of a P-type region stacked up on a N-type region vertically;
    a N+-type region as a negative electrode and a P+-type region as a positive electrode formed respectively at the two opposite ends of the channel and in the top silicon film;
    a gate dielectric layer and a gate electrode successively formed over the second channel; and
    an ESD protection node connecting with the positive electrode of the N-type gated diode ESD protection device and the negative electrode of the p-type gated diode ESD protection device;
    the N-type gated diode ESD protection device and the P-type gated diode ESD protection device are connected in serially; the negative electrode and the gate electrode of the N-type gated diode ESD protection device are connected with a positive power supply; the positive electrode and the gate electrode of the p-type gated diode ESD protection device are connected with a negative power supply or ground.

7. A method of manufacturing a ESD protection structure in SOI MOS device comprises steps of:
    providing a SOI substrate having a top silicon film, a buried oxide layer, and a silicon substrate;
    forming a longitudinal PN junction structure as a longitudinal diode including a P-type region and a N-type region in the top silicon film of the SOI substrate;
    forming a gate dielectric layer and a gate electrode layer successively over the longitudinal PN junction to form a gated diode ESD protection device;

forming a spacer and forming a P+ region as the positive electrode and a N+ region as the negative electrode respectively at the two opposite ends of the longitudinal PN junction structure.

* * * * *